United States Patent
Classen et al.

(10) Patent No.: US 10,656,173 B2
(45) Date of Patent: May 19, 2020

(54) MICROMECHANICAL STRUCTURE FOR AN ACCELERATION SENSOR

(71) Applicant: Robert Bosch GmbH, Stuttgart (DE)

(72) Inventors: Johannes Classen, Reutlingen (DE); Antoine Puygranier, Asperg (DE); Denis Gugel, Dusslingen (DE); Guenther-Nino-Carlo Ullrich, Reutlingen (DE); Markus Linck-Lescanne, Wannweil (DE); Sebastian Guenther, Tuebingen (DE); Timm Hoehr, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 114 days.

(21) Appl. No.: 15/775,219

(22) PCT Filed: Nov. 14, 2016

(86) PCT No.: PCT/EP2016/077549
§ 371 (c)(1),
(2) Date: May 10, 2018

(87) PCT Pub. No.: WO2017/085003
PCT Pub. Date: May 26, 2017

(65) Prior Publication Data
US 2018/0328959 A1    Nov. 15, 2018

(30) Foreign Application Priority Data

Nov. 16, 2015   (DE) .................. 10 2015 222 532

(51) Int. Cl.
*G01P 15/125* (2006.01)
*B81B 5/00* (2006.01)
*G01P 15/08* (2006.01)

(52) U.S. Cl.
CPC ............. *G01P 15/125* (2013.01); *B81B 5/00* (2013.01); *B81B 2201/02* (2013.01);
(Continued)

(58) Field of Classification Search
CPC ........ G01P 15/125; G01P 15/08; G01P 15/18; G01P 15/0802; B81B 3/0072; B81B 3/0086
See application file for complete search history.

(56) References Cited

U.S. PATENT DOCUMENTS

| | | | |
|---|---|---|---|
| 6,272,926 B1 * | 8/2001 | Fehrenbach | B81B 3/0051 73/514.32 |
| 6,360,605 B1 * | 3/2002 | Pinter | B81B 3/0008 73/514.32 |

(Continued)

FOREIGN PATENT DOCUMENTS

| | | |
|---|---|---|
| DE | 102009045391 A1 | 4/2011 |
| DE | 102012200740 A1 | 5/2013 |

(Continued)

OTHER PUBLICATIONS

International Search Report dated Jan. 25, 2017 of the corresponding International Application PCT/EP2016/077549 filed Nov. 14, 2016.

*Primary Examiner* — Helen C Kwok
(74) *Attorney, Agent, or Firm* — North Rose Fulbright US LLP; Gerard Messina

(57) ABSTRACT

A micromechanical structure for an acceleration sensor includes a movable seismic mass including electrodes, the seismic mass being attached to a substrate with the aid of an attachment element; first fixed counter electrodes attached to a first carrier plate; and second fixed counter electrodes attached to a second carrier plate, where the counter electrodes, together with the electrodes, are situated nested in one another in a sensing plane of the micromechanical
(Continued)

structure, and where the carrier plates are situated nested in one another in a plane below the sensing plane, each being attached to a central area of the substrate with the aid of an attachment element.

15 Claims, 14 Drawing Sheets

(52) U.S. Cl.
CPC ..... *B81B 2203/04* (2013.01); *B81B 2203/051* (2013.01); *G01P 2015/0814* (2013.01); *G01P 2015/0871* (2013.01)

(56) References Cited

U.S. PATENT DOCUMENTS

| | | | | |
|---|---|---|---|---|
| 6,494,096 B2* | 12/2002 | Sakai | ................... | B81B 3/0008 73/514.32 |
| 6,624,944 B1* | 9/2003 | Wallace | ................... | G02B 1/105 359/580 |
| 7,111,513 B2* | 9/2006 | Sugiura | ................... | G01C 19/5719 73/504.12 |
| 7,243,545 B2* | 7/2007 | Sakai | ................... | G01P 15/125 73/514.32 |
| 2002/0011112 A1* | 1/2002 | Kipp | ................... | B81B 3/0008 73/579 |
| 2002/0112538 A1* | 8/2002 | Pinter | ................... | B81B 3/0008 73/514.32 |
| 2009/0320596 A1* | 12/2009 | Classen | ................... | G01P 15/125 73/514.32 |
| 2010/0011860 A1* | 1/2010 | Offenberg | ................... | G01P 15/125 73/514.32 |
| 2010/0175473 A1* | 7/2010 | Classen | ................... | G01P 15/125 73/514.29 |
| 2011/0083506 A1* | 4/2011 | Classen | ................... | B81B 3/0072 73/504.12 |
| 2012/0139064 A1* | 6/2012 | Nakatani | ................... | B81C 1/00182 257/415 |
| 2013/0104654 A1* | 5/2013 | Classen | ................... | G01P 15/125 73/514.16 |
| 2014/0339654 A1* | 11/2014 | Classen | ................... | G01C 19/5755 257/415 |
| 2015/0123219 A1* | 5/2015 | Classen | ................... | B81B 7/0006 257/415 |
| 2015/0338246 A1* | 11/2015 | Robert | ................... | H01G 5/14 324/661 |
| 2016/0169931 A1* | 6/2016 | Tocchio | ................... | G01C 19/5712 73/514.01 |
| 2017/0052207 A1* | 2/2017 | Classen | ................... | G01P 15/125 |
| 2017/0356929 A1* | 12/2017 | Zheng | ................... | G01P 15/125 |

FOREIGN PATENT DOCUMENTS

| | | |
|---|---|---|
| DE | 102013212059 A1 | 1/2015 |
| DE | 102013222676 A1 | 5/2015 |

* cited by examiner

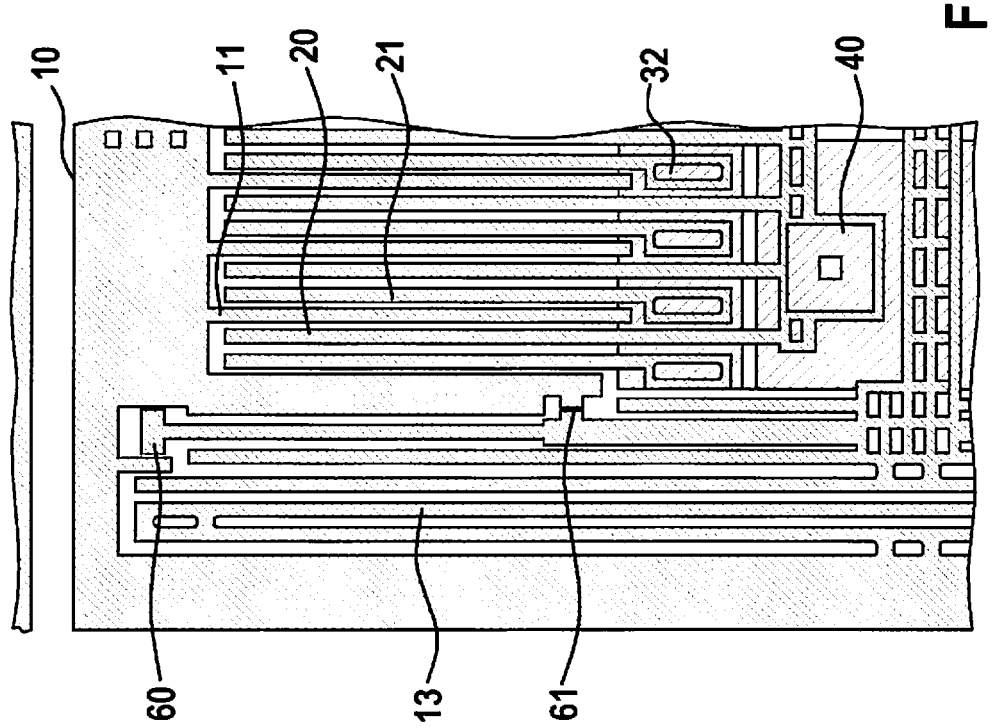

MICROMECHANICAL STRUCTURE FOR AN ACCELERATION SENSOR

CROSS-REFERENCE TO RELATED APPLICATIONS

The present application is the national stage of International Pat. App. No. PCT/EP2016/077549 filed Nov. 14, 2016, and claims priority under 35 U.S.C. § 119 to DE 10 2015 222 532.1, filed in the Federal Republic of Germany on Nov. 16, 2015, the content of each of which are incorporated herein by reference in their entireties.

FIELD OF THE INVENTION

The present invention relates to a micromechanical structure for an acceleration sensor. The present invention also relates to a method for manufacturing a micromechanical structure for an acceleration sensor.

BACKGROUND

Modern sensors for measuring acceleration generally include a micromechanical structure made from silicon ("sensor core") and evaluation electronics.

Acceleration sensors for detecting movements in the plane are known. These sensors include a movable seismic mass and electrodes. During a movement of the seismic mass, the distances between electrodes change, as a result of which, an acceleration can be detected.

SUMMARY

An object of the present invention is to provide an improved micromechanical structure for an acceleration sensor.

The object is achieved according to a first aspect with a micromechanical structure for an acceleration sensor, including: a movable seismic mass including electrodes, the seismic mass being attached to a substrate with the aid of an attachment element; fixed counter electrodes for the electrodes, first counter electrodes being attached to a first carrier plate, second counter electrodes being attached to a second carrier plate and the counter electrodes, together with the electrodes, being situated nested in one another in a sensing plane of the micromechanical structure; and the carrier plates being situated nested in one another in a plane below the sensing plane and each being attached to a central area of the substrate with the aid of an attachment element.

In this way, attachment structures for the counter electrodes and the seismic mass are space-optimized and thus designed in a resource-efficient manner. As a result, an attachment area or anchoring area for attachment to the substrate is condensed and compactly designed, as a result of which the entire sensor can have an advantageously smaller design.

According to another aspect, the object is achieved with a method for manufacturing a micromechanical structure for an acceleration sensor, including the steps: providing a substrate; designing electrodes in a movably designed seismic mass; attaching the movable seismic mass to the substrate with the aid of an attachment element; designing fixed counter electrodes for the electrodes; first counter electrodes and second counter electrodes each being situated on one carrier plate; the electrodes, together with the counter electrodes, being situated nested in one another in a sensing plane of the micromechanical structure; and the seismic mass and the carrier plates being attached with the aid of a respective attachment element to a central area of the substrate.

One advantageous refinement of the micromechanical structure is distinguished by that the seismic mass is attached to the substrate with the aid of two attachment elements, the attachment elements for the first carrier plate and second carrier plate being situated at the same level on the substrate in the sensing direction of the seismic mass, the attachment elements being situated mirror-symmetrically on the substrate. In this way, an even higher degree of symmetry for the micromechanical structure can be provided. As a result, even better sensing properties for the micromechanical acceleration sensor are provided in this way.

Another advantageous refinement of the micromechanical structure is distinguished by that a reinforcing element for reinforcing the carrier plate is situated on each carrier plate. In this way, it is advantageously provided that the carrier plates for the counter electrodes are mechanically not overstressed. A protection of the aforementioned carrier plates against, for example, oscillating is thereby implementable in a simple manner.

One advantageous refinement of the micromechanical structure provides that the seismic mass includes two spring elements situated symmetrically relative to one another, four stop elements spaced apart from one another being formed in each spring element, two first stop elements being spaced further apart from one another than two second stop elements. This provides cascaded stops for the seismic mass, as a result of which, it is provided that mechanical stop energy (for example, due to an impact of the structure against the ground) can be successively reduced in consecutively occurring stop processes.

Another advantageous refinement of the micromechanical structure is distinguished by that two third stop elements, offset by ninety degrees, are formed outside of corner areas of the seismic mass. In this way, a stop area is provided for particularly high stop energy, as a result of which impact processes of the micromechanical structure can be largely dampened.

Another advantageous refinement of the micromechanical structure provides that areas of the seismic mass, which are provided for an attachment of a defined number of electrical strip conductors, are perforated. As a result, it is provided that the seismic mass can be designed largely unperforated, which results in a greater density and, therefore, a higher mass. A sensing behavior of the acceleration sensor can be improved in this way.

Another advantageous refinement of the micromechanical structure provides that a first electrical potential is conveyable to the first counter electrodes, that a second electrical potential is conveyable to the second counter electrodes, and that a ground potential is conveyable to the electrodes. As a result, suitable electrical potentials are provided in order to enable an efficient sensing of differential capacitance changes during an interaction of the movable electrodes, connected to the ground potential, with the counter electrodes.

Another advantageous refinement of the micromechanical structure is characterized in that the counter electrodes are formed in a first functional layer, spacer elements are formed in a second functional layer, the carrier plates are formed in a third functional layer, and the attachment elements are formed in a fourth functional layer. In this way, the individual elements are formed in different functional layers of semiconductor material, as a result of which a manufacturing of the micromechanical structure according to known methods of semiconductor micromechanics is provided.

The present invention is described in detail below with additional features and advantages with reference to multiple figures. Identical or functionally identical elements have the same reference numerals. The figures are not necessarily drawn to scale.

Disclosed device features result analogously from corresponding disclosed method features and vice versa. This means, in particular, that features, technical advantages, and embodiments relating to the micromechanical structure result analogously from corresponding embodiments, features, and advantages of the method for manufacturing the micromechanical structure and vice versa.

BRIEF DESCRIPTION OF THE DRAWINGS

FIG. 8 shows a detailed view of the structure of FIG. 7.

DETAILED DESCRIPTION

Figure 1:
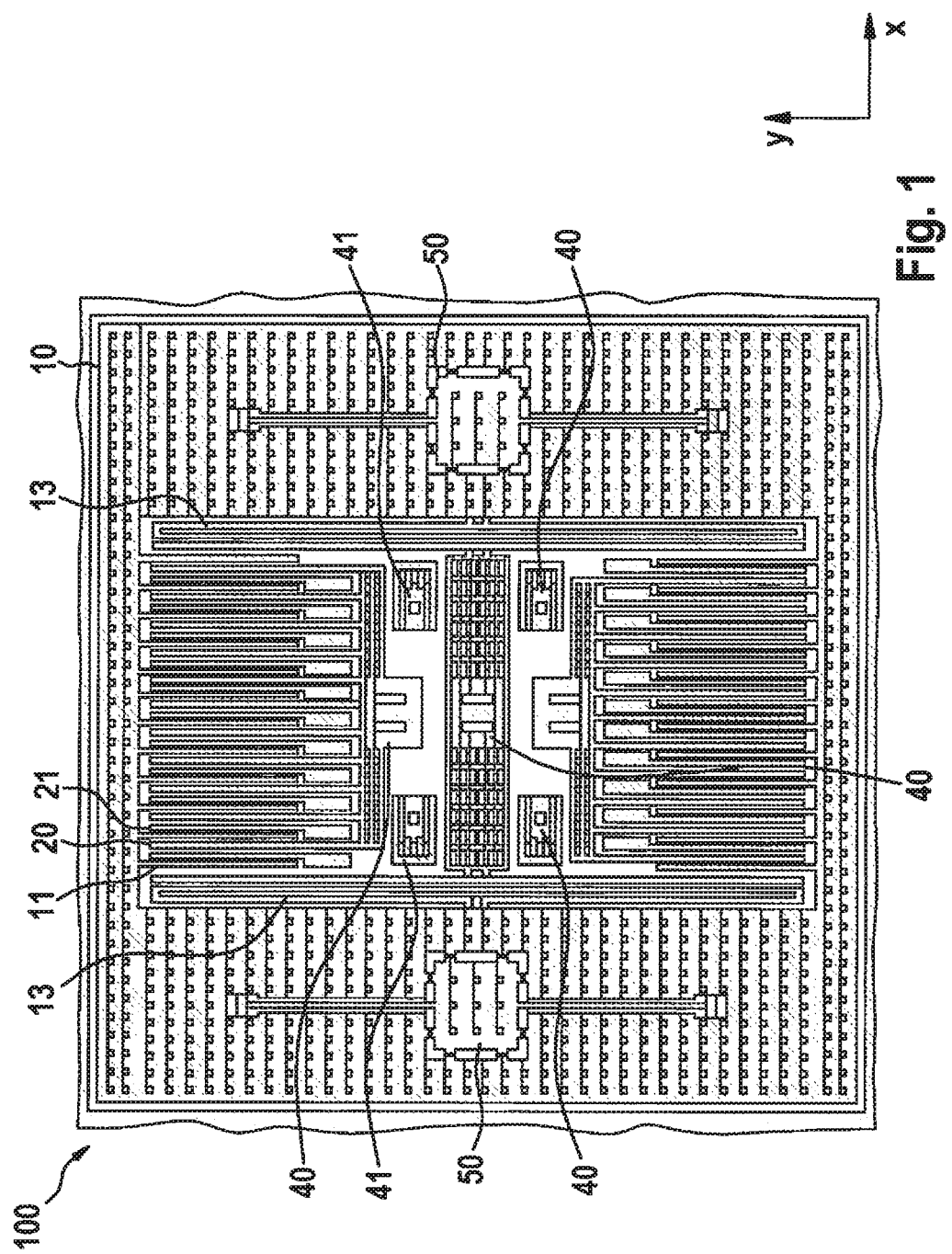
FIG. 1 shows a top view of a conventional micromechanical structure for an acceleration sensor.

FIG. 1 shows a top view of a conventional micromechanical structure 100 for an acceleration sensor. Micromechanical structure 100 includes a movable seismic mass 10, which is attached to or anchored on a substrate 1 ("mainland" not depicted) situated below seismic mass 10 with the aid of a centrally situated attachment element 12. Seismic mass 10 is movably mounted with the aid of two spring elements 13 and of attachment element 12, the two spring elements 13 being connected to each other via an oblong, perforated beam element or bar element. Overload limiting elements 50 are provided to prevent a deflection of seismic mass 10 during overload. A sensing direction of depicted micromechanical structure 100 corresponds to an x-direction of a coordinate system depicted in FIG. 1.

Movable seismic mass 10 includes electrodes 11 extending inwardly into a central area of seismic mass 10, which are connected to the ground potential and which interact with first counter electrodes 20 and with second counter electrodes 21, in order in this way to sense differential capacitance changes during a deflection of seismic mass 10 in the plane. Counter electrodes 20, 21 are attached to or anchored on substrate 1 with the aid of a respective attachment element 40, 41.

Figure 2:
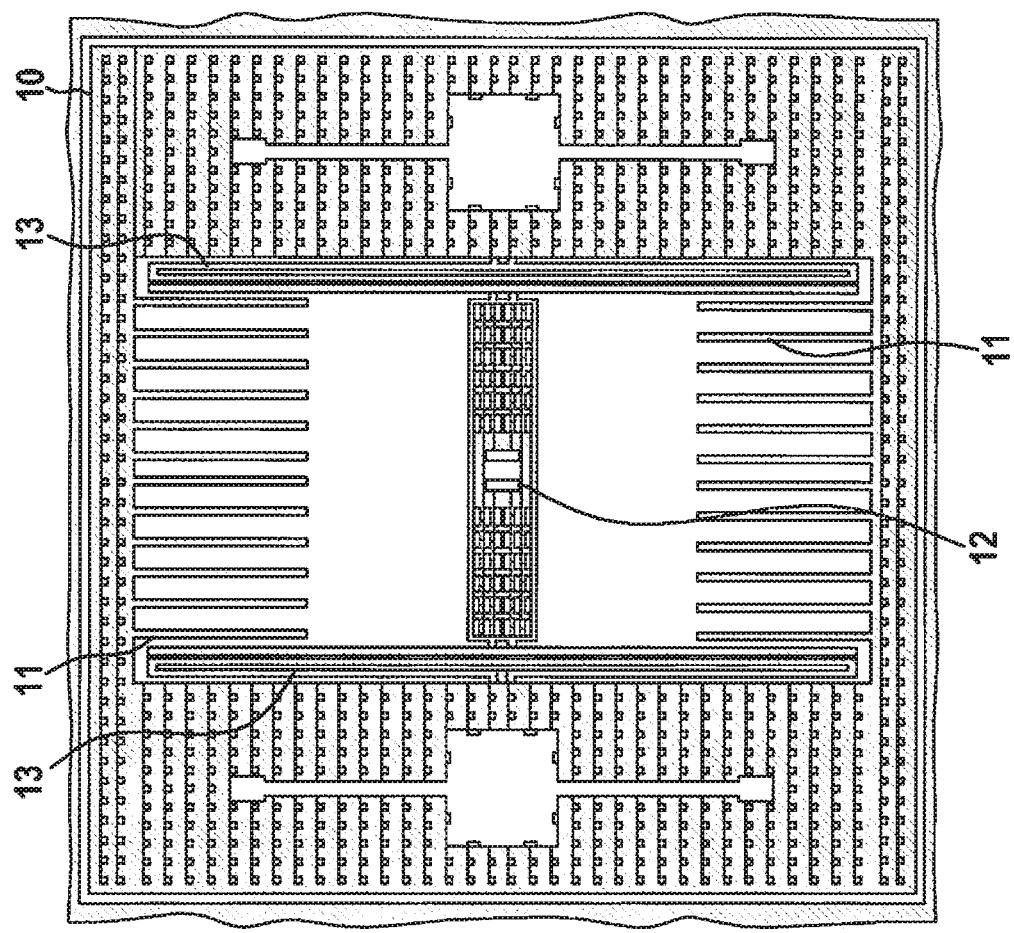
FIGS. 2-4 show detailed views of the structure of FIG. 1.

FIG. 2 shows a top view of seismic mass 10 of FIG. 1. The central attachment of seismic mass 10 to substrate 1 with the aid of attachment element 12, as well as recesses for overload limiting elements 50 (not depicted), are apparent. Also apparent are inwardly extending electrodes 11.

Figure 3:
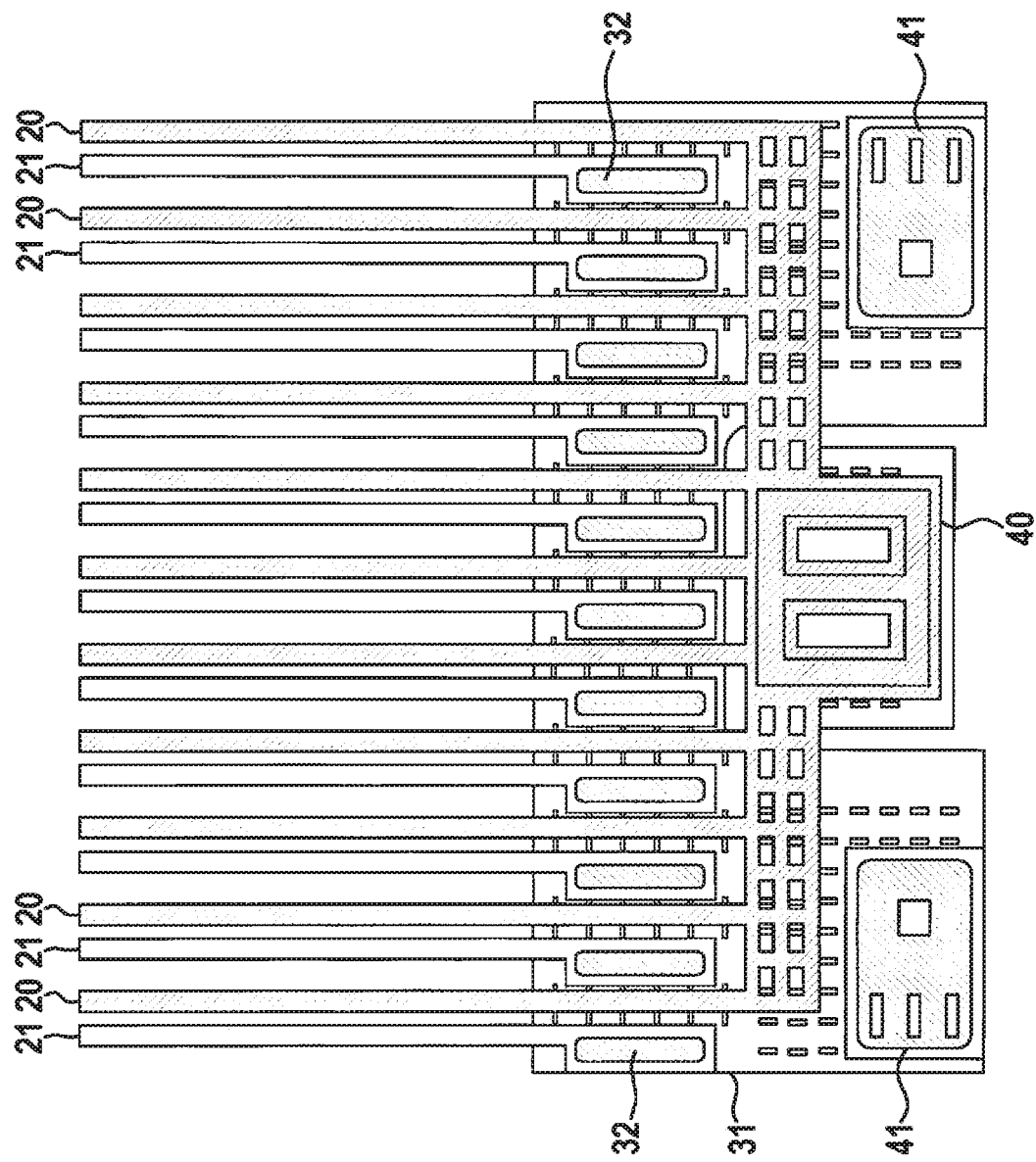

FIG. 3 shows a half of counter electrodes 20, 21 for seismic mass 10 in a top view with corresponding attachment elements 40, 41. In this case, second counter electrodes 21 are situated on a second carrier plate 31, spacer elements 32 being provided in order to situate second counter electrodes 21 at a defined level on carrier plate 31.

Figure 4:
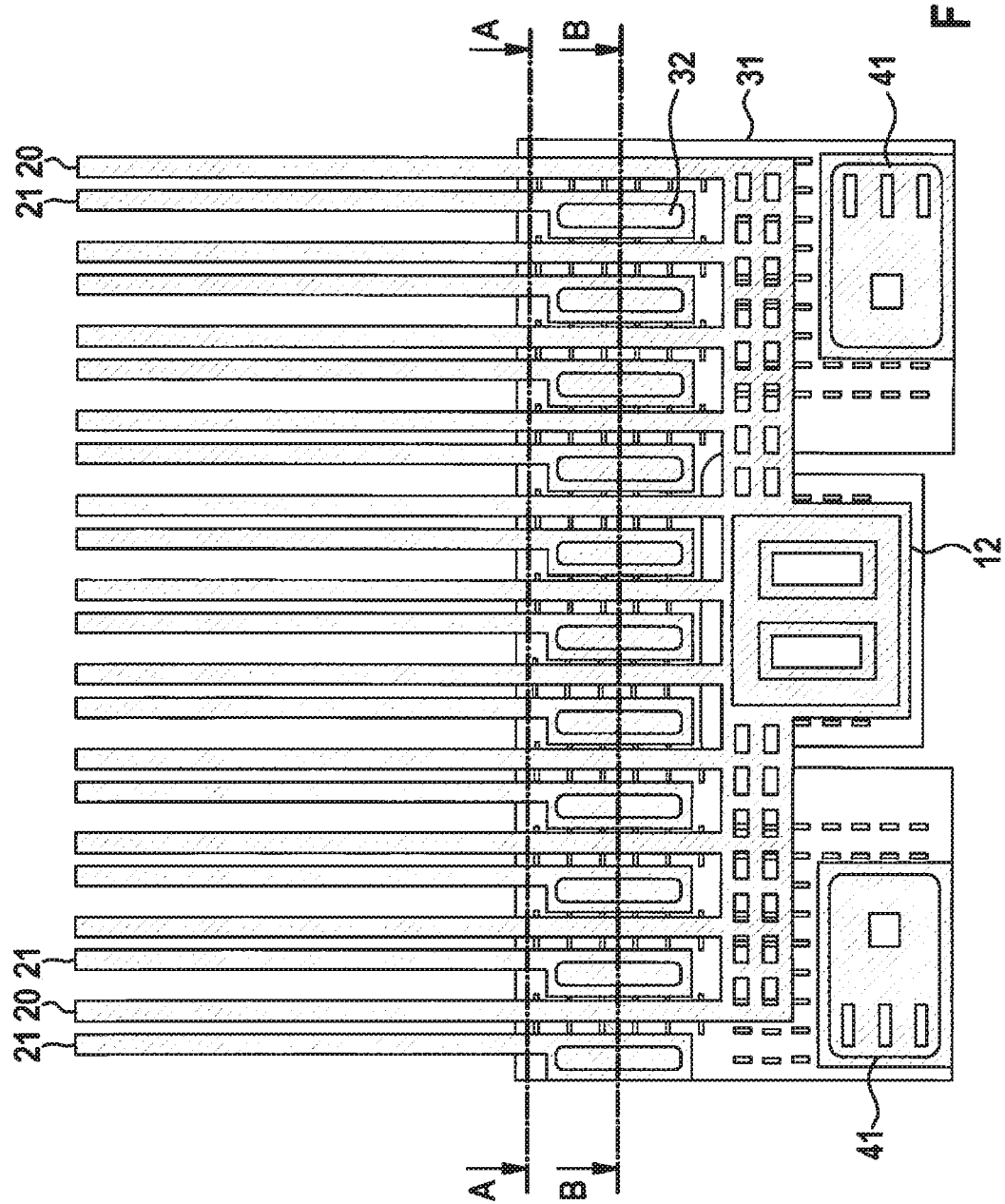
Figure 5:
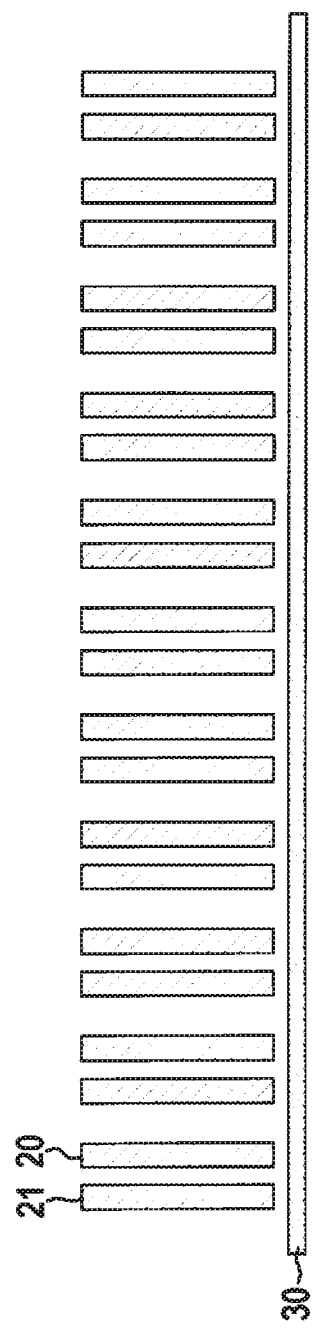
FIGS. 5 and 6 show cross-sectional views through sections of the structure of FIG. 4.
Figure 6:
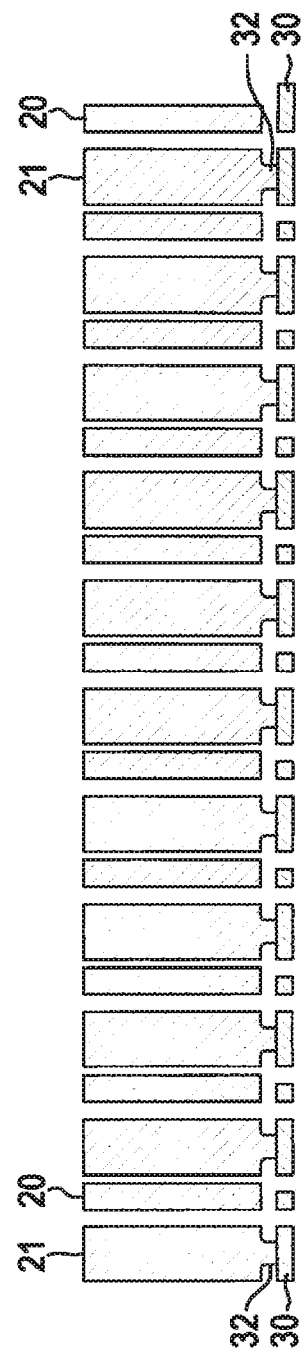

FIG. 4 shows the structure of FIG. 3 in another representation, two sections A-A and B-B being indicated, along which cross-sectional views of the structure are depicted in FIGS. 5 and 6. Second carrier plate 31 for second counter electrodes 21 is apparent.

Counter electrodes 20, 21 are formed in a first functional layer of semiconductor material, preferably silicon; spacer elements 32 between carrier plates 30, 31 and counter electrodes 20, 21 are formed in a second functional layer of the semiconductor material; carrier plates 30, 31 are formed in a third functional layer of the semiconductor material; and attachment elements 40, 41 are formed in a fourth functional layer of the semiconductor material. All cited functional layers are situated in different planes of the semiconductor material.

FIG. 5 shows the structure along section A-A of FIG. 4. Counter electrodes 20, 21 are apparent above first carrier plate 30.

FIG. 6 shows the section along section line B-B of FIG. 4, in which it is apparent that second counter electrodes 21 are connected to first carrier plate 30 with the aid of spacer elements 32.

Figure 7:
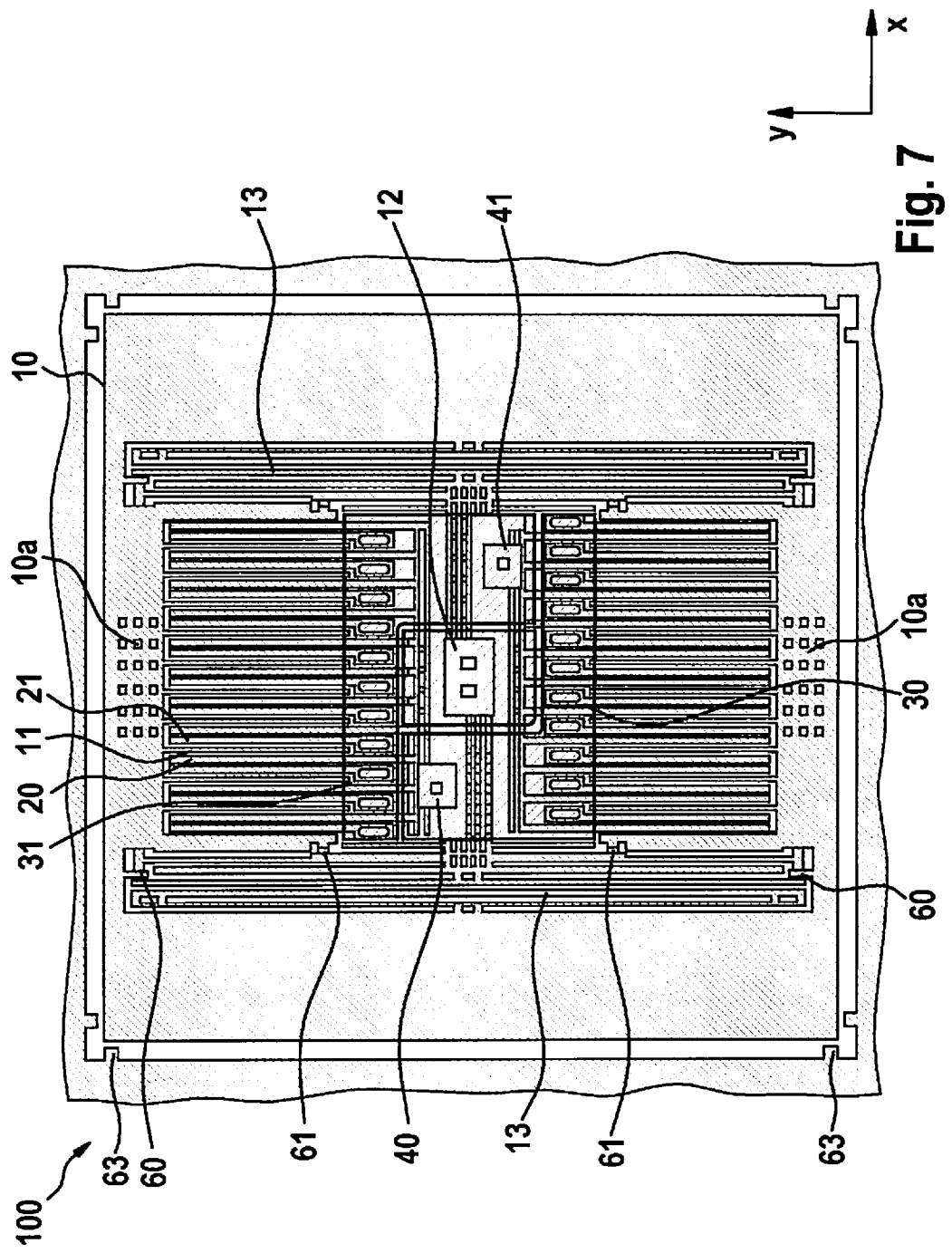
FIG. 7 shows a top view of a micromechanical structure according to an example embodiment of the present invention.

FIG. 7 shows a top view of a first example embodiment of micromechanical structure 100 according to the present invention. A specific configuration or arrangement of the attachment elements or anchorings of carrier plates 30, 31 and of mass 10 on substrate 1 is apparent, so that in this way a compact "central attachment" for fixed counter electrodes 20, 21 is implemented.

It is apparent from a hatched indication that carrier plates 30, 31 are situated below the structures of seismic mass 10, first counter electrodes 20 being situated on first carrier plate 30 and second counter electrodes 21 being situated on second carrier plate 31.

Two carrier plates 30, 31 are now formed in an L-shape in the central area of micromechanical structure 100 and situated nested in one another in a plane below electrode structures 11, 20, 21.

Also apparent is an additional plate situated around central attachment 12 at the same level as carrier plates 30, 31, which are provided so that attachment element 12 is not undercut.

As a result, this means that now three attachment structures or anchoring structures of carrier plates 30, 31 are present with substrate 1, which are situated in a space-saving manner in a central area of micromechanical structure 100, namely, attachment element 12 for seismic mass 10 and attachment elements 40, 41 for first and second carrier plates 30, 31. In this way, the attachment area can have a compact design, which can significantly reduce an overall size of a sensor device including micromechanical structure 100, in terms of scale, to an extent of up to approximately 30%. The result for micromechanical structure 100 is a point-symmetric design of the attachment structures on substrate 1. Just as in the conventional structure of FIG. 1, a sensing direction of micromechanical structure 100 of FIG. 7 extends in x-direction of an indicated Cartesian coordinate system.

It is further apparent from FIG. 7 that the main portion of movable seismic mass 10 is unperforated and is perforated only in defined areas 10a, structures for applying electrical potentials to counter electrodes 20, 21 being provided in these perforated areas 10a, as is explained in greater detail below. The lack of perforation provides seismic mass 10 with a high density, which can enhance detection properties of an acceleration sensor.

A first stop element 60 is apparent in an upper section of spring element 13, which functions to dampen a low overload on seismic mass 10. A second stop element 61 is also apparent in spring element 13, which is able to dampen a higher overload on seismic mass 10. As a result, the total of four stop elements 60, 61 per spring element 13 are formed "cascaded," which provides a space-saving damping structure for micromechanical structure 100. This can be helpful, in particular, in the case of so-called "sticking problems" of seismic mass 10. Sticking is often problematical in the case of such small structures, because surface forces often gain the upper hand as compared to other forces.

In this way, it is possible for seismic mass 10 to strike against stop elements 60, 61 during average overload (forces up to approximately 10,000 G). Seismic mass 10 strikes against third stop elements 63 situated outside seismic mass 10 only in the case of overload. This has the advantage that the internal stop elements 60, 61 can be connected to a shared ground potential.

FIG. 8 shows a top view of an enlarged detail of the structure of FIG. 7.

Figure 9:
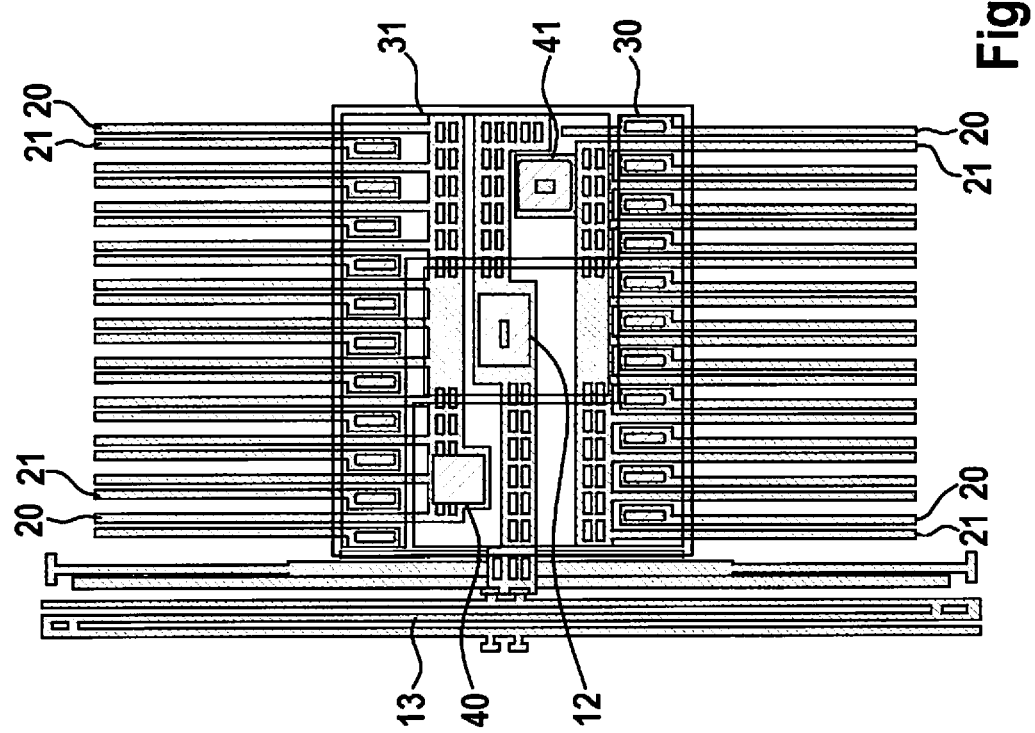
FIG. 9 shows another detailed view of the structure of FIG. 7.

FIG. 9 is a top view of a subsection of micromechanical structure 100 according to the present invention. It is apparent that the anchoring of counter electrodes 20, 21 and of seismic mass 10 has been advantageously reduced from seven to three elements, as compared to conventional structure 100. For this purpose, an attachment element 40 is provided for first carrier plate 30, an attachment element 41 is provided for second carrier plate 31, and attachment segment 12 is provided for seismic mass 10, all aforementioned attachment elements being provided for attaching the corresponding elements to substrate 1. In this way, counter electrodes 20, 21 "hang" on both sides of seismic mass 10, each on an individual attachment element 40, 41.

Figure 10:
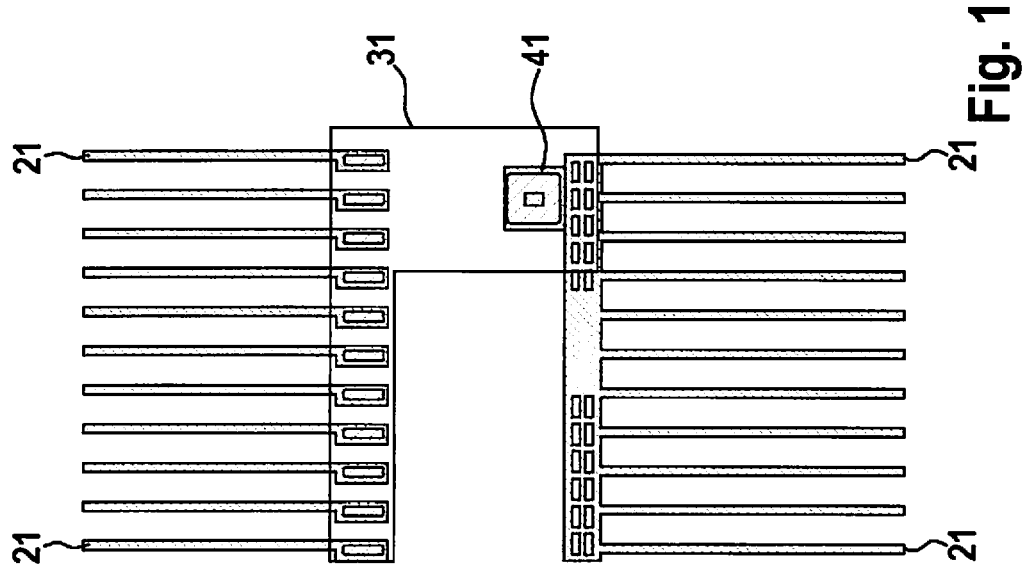
FIG. 10 shows another detailed view of the structure of FIG. 7.

For the sake of clarity, FIG. 10 shows only second counter electrode 21, which is situated on second carrier plate 31 and which is present at the same electrical potential. In order to establish the required electrical contact, it is provided that a strip conductor is guided from the outside to attachment element 41 with the aid of a conducting element (not depicted), which is formed in a strip conductor plane of the semiconductor structure. Attachment element 41 for attaching second carrier plate 31 to substrate 1 is apparent.

Figure 11:
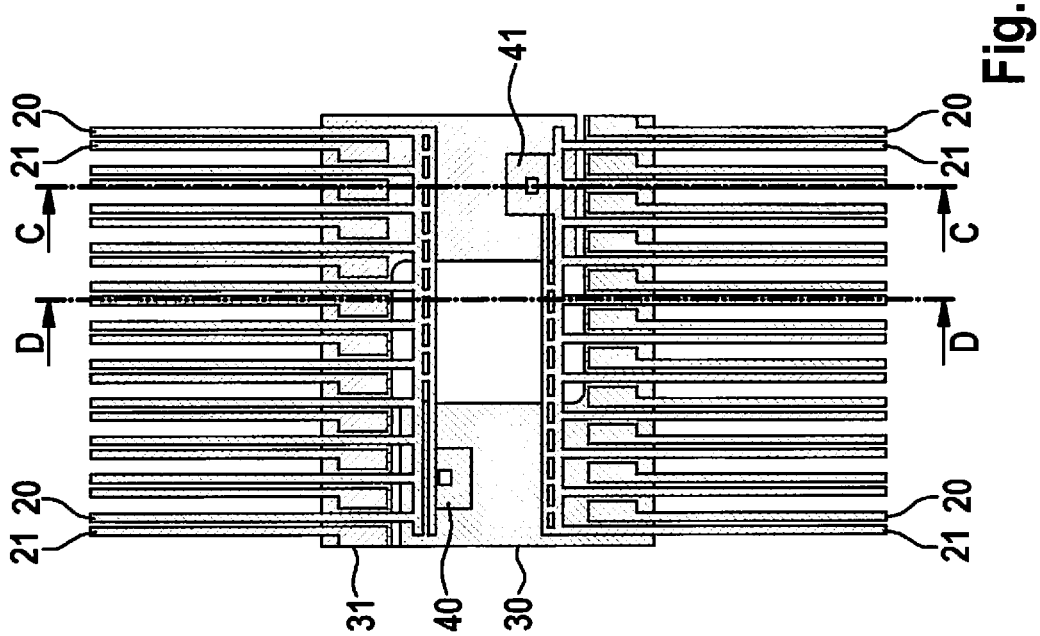
FIG. 11 shows a detailed view of the micromechanical structure with a highlighting of electrical potentials, according to an example embodiment of the present invention.

FIG. 11 shows a top view of the entirety of first and second counter electrodes 20, 21, including a graphic highlighting of electrical potentials. It is apparent that the electrical potentials of first counter electrodes 20 and the electrical potentials of second counter electrodes 21 are different, in order in this way to detect differential capacitance changes in the interaction with moveable electrodes 11 (not depicted in FIG. 11). Carrier plates 30, 32 are situated in the same plane, counter electrodes 20, 21 situated on the carrier plates being nested to a certain extent with the movable electrodes 11, so that they are movable with electrodes 11 in a plane ("sensing plane") in the sensing direction.

Figure 12:
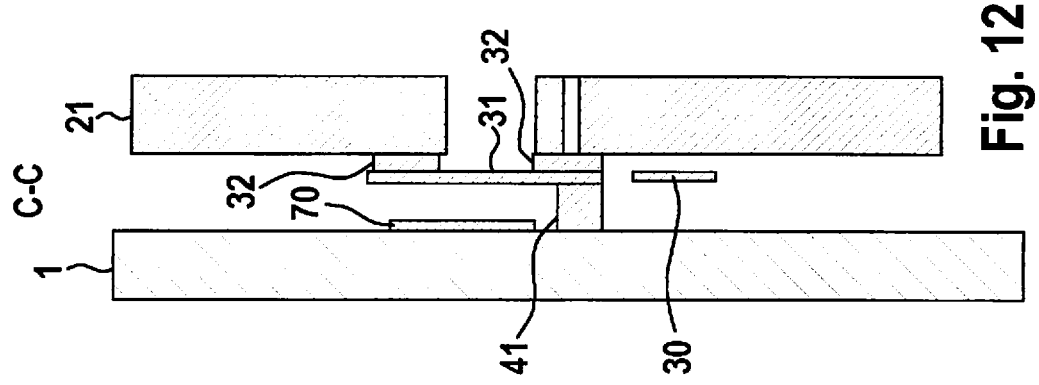
FIG. 12 shows a cross-sectional view of a section of the structure of FIG. 11.

FIG. 12 shows a cross-sectional view along a section C-C of FIG. 11. It is apparent that attachment element 41 is provided in order to anchor second carrier plate 31 on substrate 1, spacer elements 32 being provided on second carrier plate 31, on which second counter electrodes 21 are situated a defined distance from carrier plate 31.

Figure 13:
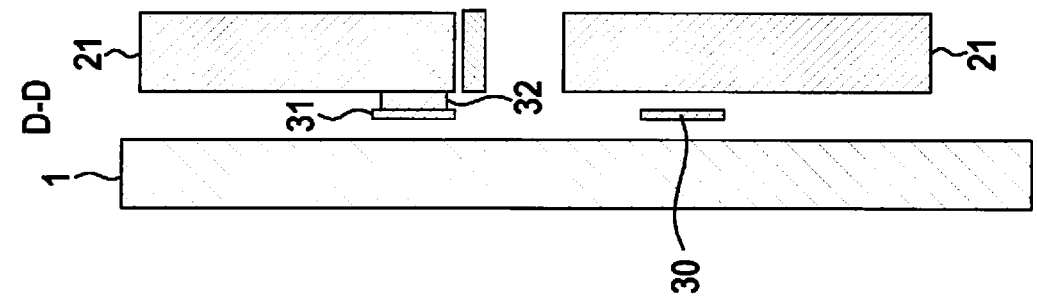
FIG. 13 shows another cross-sectional view of a section of the structure of FIG. 11.

FIG. 13 shows a cross-sectional view along a section D-D of FIG. 11.

The sectional views of FIG. 12 and FIG. 13 are to be merely qualitatively understood and are not necessarily depicted true to scale or oriented precisely to the structures of FIG. 11. A conducting element 70 for conveying a provided electrical potential to counter electrodes 20, 21 and to seismic mass 10 is further apparent in FIG. 12.

Figure 14:
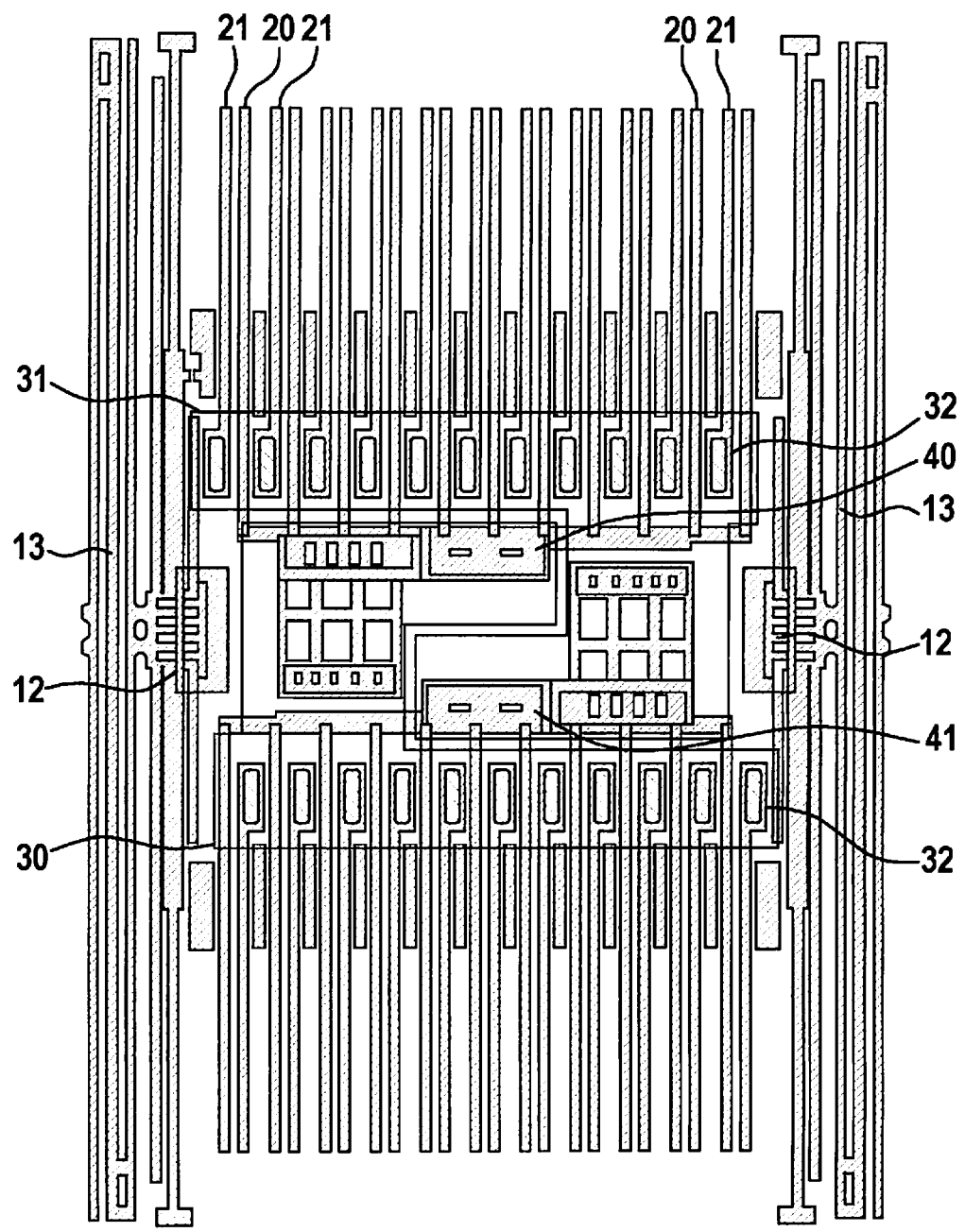
FIG. 14 shows a top view of the micromechanical structure according to another example embodiment of the present invention.

FIG. 14 shows a top view of an alternative example embodiment of micromechanical structure 100 according to the present invention. In this variant, it is apparent that now two attachment elements 12 are provided for seismic mass 10, each of which is connected to a spring element 13 and spaced apart from the central area. In addition, the two carrier plates 30, 31 for the counter electrodes are now virtually "U-shaped" and situated nested in one another, attachment elements 40, 41 for counter electrodes 20, 21 being centrally situated. It is apparent that, as a result, attachment elements 40, 41 for the first carrier plate and second carrier plate are situated at the same level on substrate 1 in the sensing direction of seismic mass 10, the attachment elements being situated mirror-symmetrically on the substrate.

As a result, a mirror-symmetrical arrangement of attachment elements 12, 40, 41 is implemented in this way, as a result of which a degree of symmetry of the anchoring area of carrier plates 30, 31 and of seismic mass 10 is implemented, which is greater compared to the variant of FIG. 7. In this way, a sensing characteristic of the acceleration sensor, which to a high degree is a function of a symmetry of the structures used, is improved.

Figure 15:
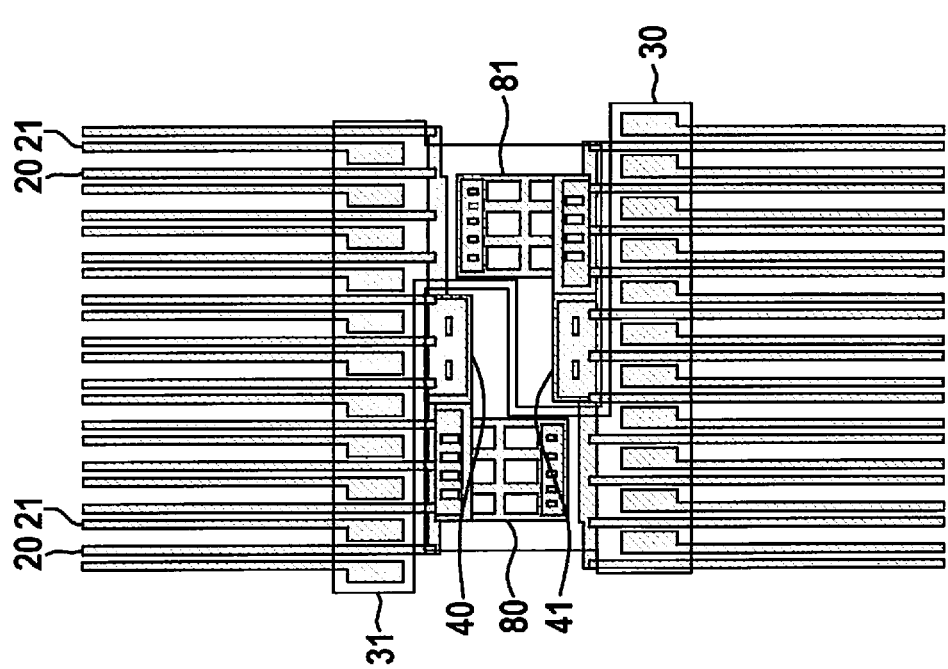
FIG. 15 shows a detailed view of the structure of FIG. 14.

FIG. 15 shows a detail of the structure of FIG. 14, two reinforcing elements 80, 81 being apparent, which are situated on a corresponding carrier plate 30, 31. Reinforcing elements 80, 81 are intended above all to reinforce the thin, U-shaped carrier plates 30, 31 (thickness approximately 1 μm to approximately 2 μm) in a central area, so that they are protected from an oscillation or other mechanical deformations.

Figure 16:
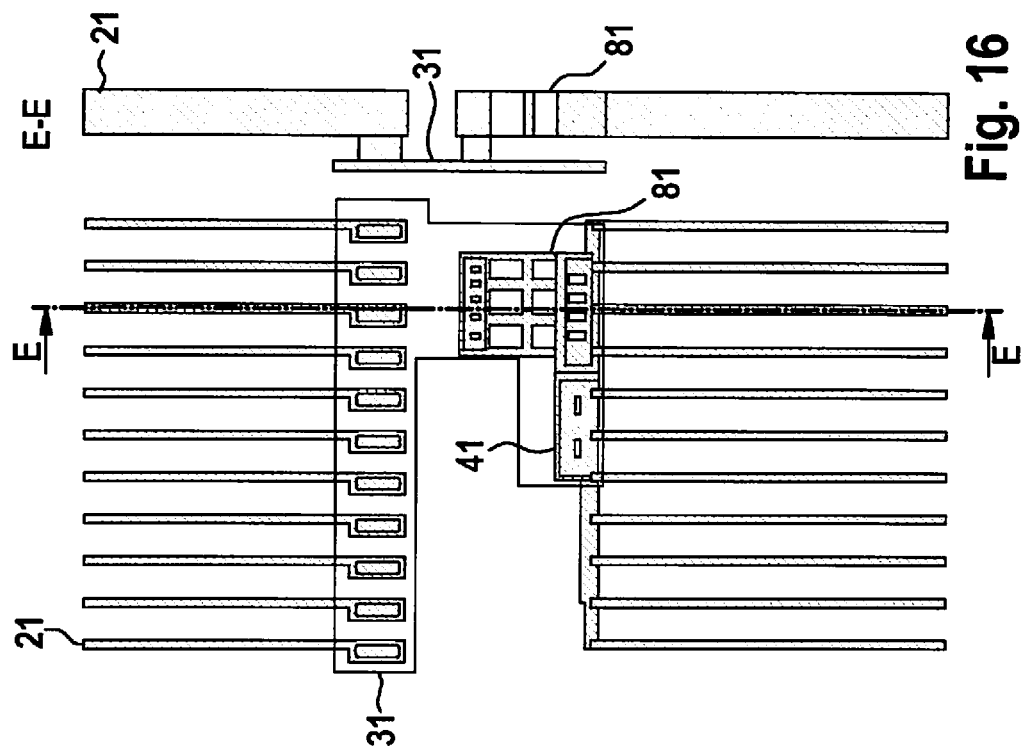
FIG. 16 shows another detailed view of the structure of FIG. 14.

FIG. 16 shows second counter electrodes 21 at the same electrical potential, together with second carrier plate 31 and with reinforcing element 81. A cross-sectional view along a section E-E is depicted in a right section of FIG. 16.

Figure 17:
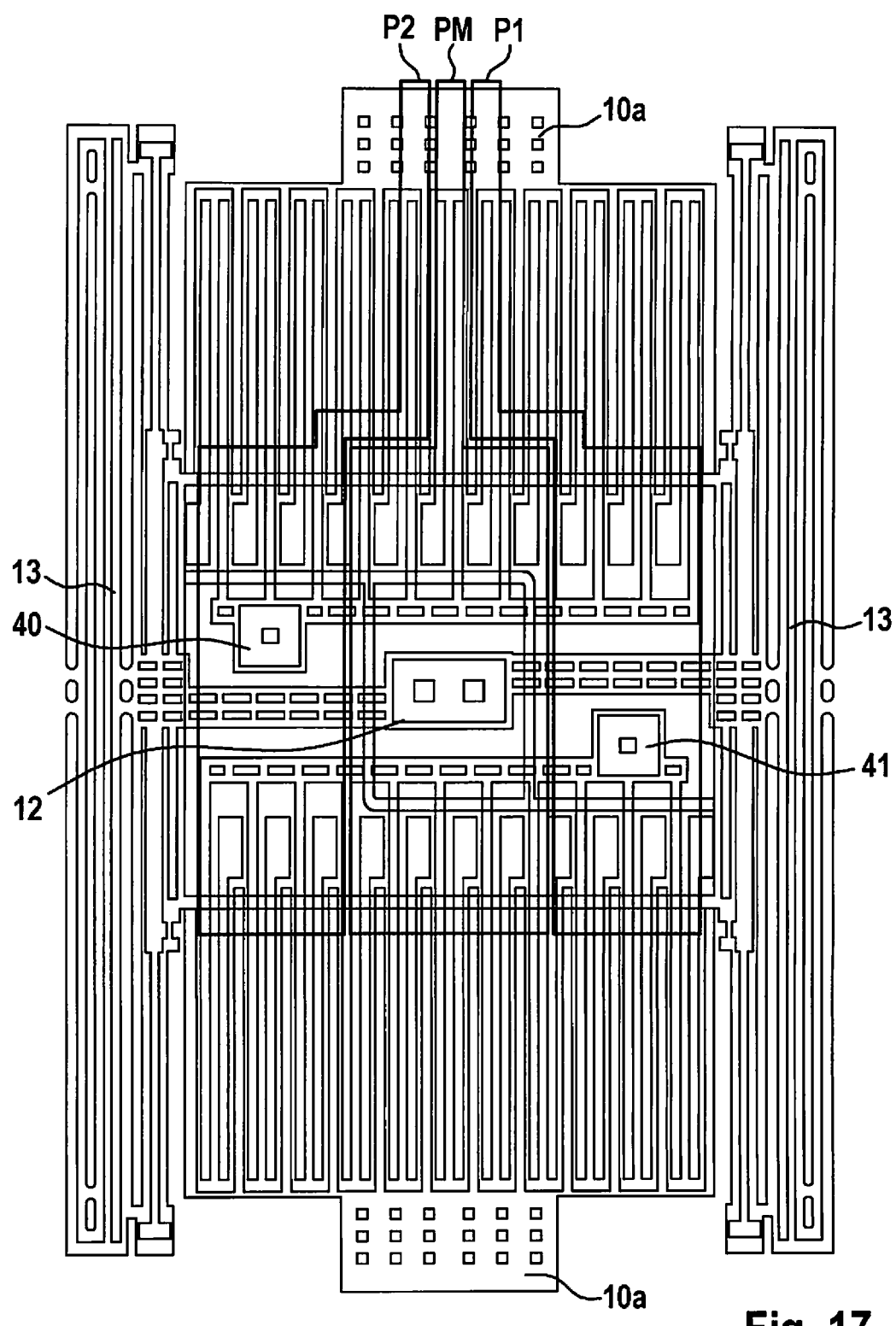
FIG. 17 shows an indication of electrical potentials of individual electrodes of the micromechanical structure, according to an example embodiment of the present invention.

FIG. 17 shows a top view of one example embodiment of micromechanical structure 100 including an indication of electrical potentials of counter electrodes 20, 21 and of attachment element 12. All first counter electrodes 20 are each functionally electrically interconnected with one another and in this way each exhibits the same electrical potential P1. All second counter electrodes 21 are each functionally electrically interconnected with one another and in this way each exhibits the same electrical potential P2. Central attachment element 12 for seismic mass 10 is connected to the ground potential. One advantage of carrier plates 30, 31 formed in the third functional layer of the semiconductor structure is that they are present at the substrate potential. As a result, the movements of conducting elements 70, which can arise as a result of deformation, are electrostatically decoupled from counter electrodes 20, 21. As a result, undesirable signals can advantageously be largely avoided during a movement of counter electrodes 20, 21.

An electrical wiring of the entire micromechanical structure 100 is indicated with the top view of FIG. 17. It is apparent that different electrical potentials P1, P2, PM are guided to counter electrodes 20, 21 and to attachment elements 12 in perforated areas 10a of seismic mass 10. As shown, provided for such purpose are a conducting element to which a first electrical potential P1 is applied, a conducting element to which a second electrical potential P2 is applied, and a conducting element to which ground potential PM is applied. It is also apparent that ground potential PM is also applied to the central attachment area of movable seismic mass 10. In this way, suitable electrical potentials of counter electrodes 20, 21 are implemented, in order to detect differential capacitance changes during a movement of ground electrodes 11 between counter electrodes 20, 21.

Figure 18:
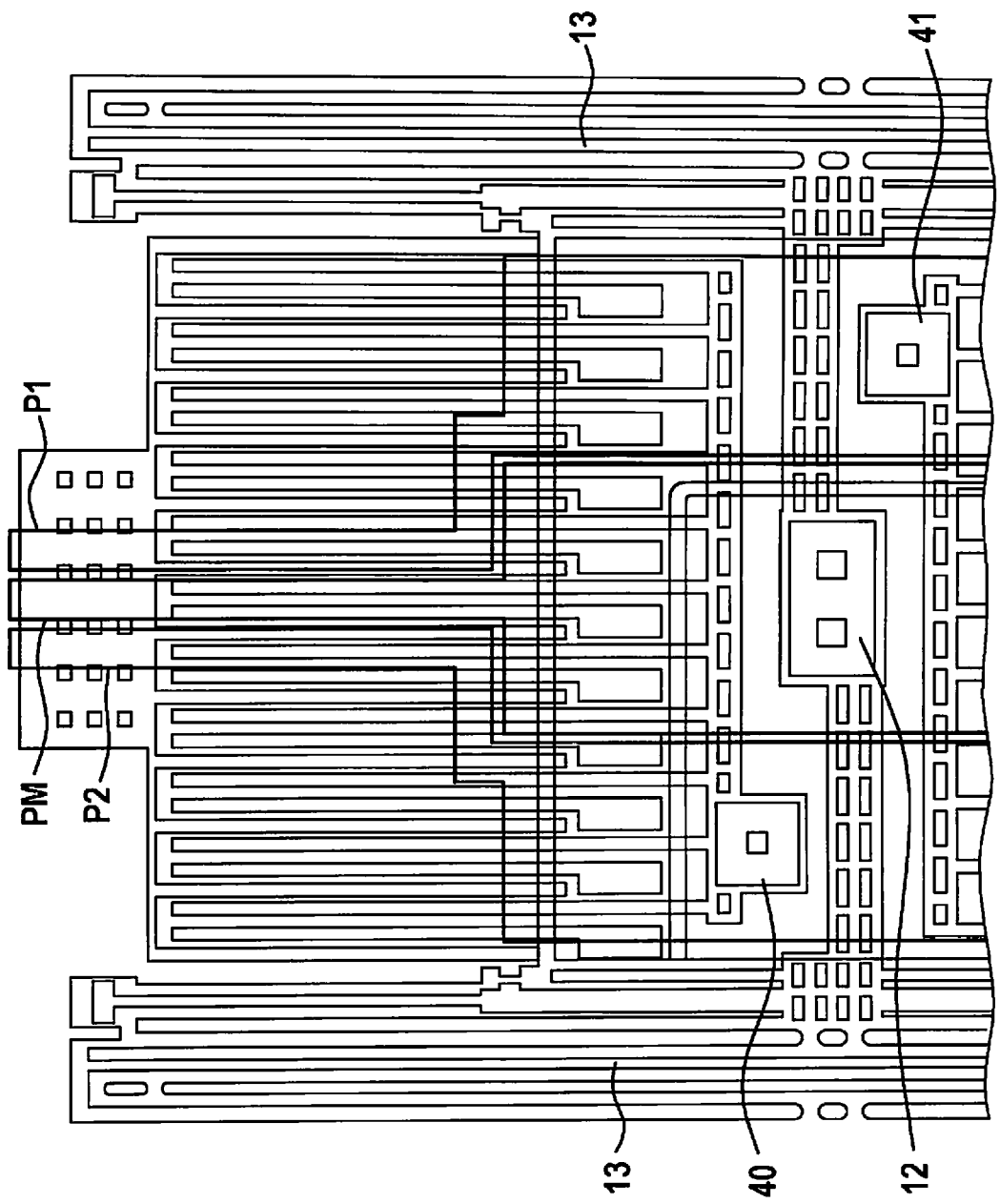
FIG. 18 shows a detailed view of the structure of FIG. 17.

FIG. 18 shows a detail of FIG. 17 in an enlarged representation for illustrating the explained principle. Three strip conductors are apparent, which are attached to three attachment elements 12, 42 and 41.

Figure 19:
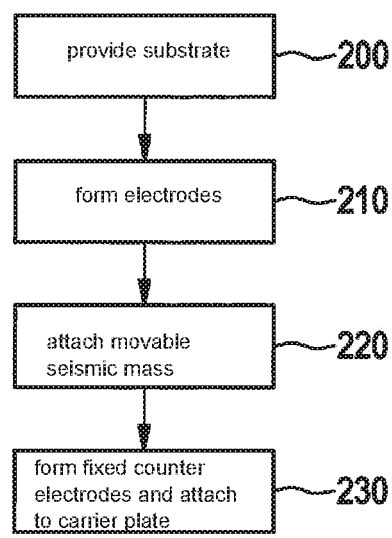
FIG. 19 is a flowchart that illustrates a sequence of a method according to an example embodiment of the present invention.

FIG. 19 is a flowchart of and example embodiment of a method for manufacturing a micromechanical structure 100 for an acceleration sensor. A substrate 1 is provided in a step 200. A formation of electrodes 11 in a movably designed seismic mass 10 is carried out in a step 210. In a step 220, movable seismic mass 10 is attached to substrate 1 with the aid of an attachment element 12. In a step 230, fixed counter electrodes 20, 21 are formed for electrodes 11, first counter electrodes 20 and second counter electrodes 21 being attached on one carrier plate 30, 31 respectively, electrodes 11, together with counter electrodes 20, 21 being situated nested in one another in a sensing plane of micromechanical structure 100, seismic mass 10 and carrier plates 30, 31 each being attached in a central area of substrate 1 with the aid of one attachment element 12, 40, 41.

In summary, a micromechanical structure for an acceleration sensor is provided with the present invention, which advantageously provides a compact anchoring structure for the seismic mass and for the counter electrodes for the ground electrodes on the substrate. As a result, a compact and therefore cost-efficient design for a micromechanical acceleration sensor can be implemented.

Although the present invention has been described with reference to specific example embodiments, it is by no means limited thereto. Those skilled in the art will therefore recognize that diverse modifications are possible, which were not previously described or only partially described above, without departing from the core of the present invention.

What is claimed is:

1. A micromechanical structure for an acceleration sensor, including:
    a substrate;
    a movable seismic mass including electrodes and attached to the substrate via at least one attachment element;
    a first carrier plate;
    a second carrier plate;
    first fixed counter electrodes, for the electrodes of the seismic mass, attached to the first carrier plate;
    second fixed counter electrodes, for the electrodes of the seismic mass, attached to the second carrier plate;
    wherein:
        the first and second fixed counter electrodes together with the electrodes of the seismic mass are situated nested in one another in a sensing plane of the micromechanical structure; and
        the carrier plates are situated nested in each other in a plane below the sensing plane and are each attached to a central area of the substrate via a respective attachment element.

2. The micromechanical structure of claim 1, wherein:
    the at least one attachment element includes two attachment elements;
    the attachment elements via which the carrier plates are attached to the central area of the substrate are situated at a same level on the substrate with respect to a sensing direction of the seismic mass; and
    the two attachment elements via which the movable seismic mass is attached to the substrate and the attachment elements via which the carrier plates are attached to the central area of the substrate are situated mirror-symmetrically on the substrate.

3. The micromechanical structure of claim 2, further comprising, on each of the carrier plates, a respective reinforcing element that reinforces the respective carrier plate.

4. The micromechanical structure of claim 1, wherein the seismic mass includes two spring elements that are situated symmetrically to each other and that each includes four stop elements spaced apart from one another, with two of the four stop elements being spaced further apart from each other than the other two of the four stop elements are spaced apart from each other.

5. The micromechanical structure of claim 4, further comprising, at each of exterior corners of, and exterior to the seismic mass, a respective pair of stop elements that are offset from each other by ninety degrees.

6. The micromechanical structure of claim 1, wherein areas of the seismic mass are perforated for attachment of electrical strip conductors.

7. The micromechanical structure of claim 1, wherein a first electrical potential is conveyable to the first fixed counter electrodes, a second electrical potential is conveyable to the second fixed counter electrodes, and a ground potential is conveyable to the electrodes of the seismic mass.

8. The micromechanical structure of claim 1, wherein the first and second fixed counter electrodes are formed in a first functional layer, spacer elements are formed in a second functional layer, the carrier plates are formed in a third functional layer, and the attachment elements are formed in a fourth functional layer.

9. An acceleration sensor comprising a micromechanical structure, wherein the micromechanical structure includes:
    a substrate;
    a movable seismic mass including electrodes and attached to the substrate via at least one attachment element;
    a first carrier plate;
    a second carrier plate;
    first fixed counter electrodes, for the electrodes of the seismic mass, attached to the first carrier plate;
    second fixed counter electrodes, for the electrodes of the seismic mass, attached to the second carrier plate;
    wherein:

the first and second fixed counter electrodes together with the electrodes of the seismic mass are situated nested in one another in a sensing plane of the micromechanical structure; and the carrier plates are situated nested in each other in a plane below the sensing plane and are each attached to a central area of the substrate via a respective attachment element.

10. A method for manufacturing a micromechanical structure for an acceleration sensor, the method comprising:

attaching, to a central area of a substrate and via at least one attachment element, a seismic mass that is movable relative to the substrate and that includes first electrodes;

providing first fixed counter electrodes attached to a first carrier plate, the first fixed counter electrodes being for the electrodes of the seismic mass;

providing second fixed counter electrodes attached of a second carrier plate, the second fixed counter electrodes being for the electrodes of the seismic mass; and attaching the first carrier plate and the second carrier plate to the central area of the substrate via respective attachment elements, such that the first electrodes together with the first and second fixed counter electrodes are nested in one another in a sensing plane of the micromechanical structure, and the first carrier plate and the second carrier plate are nested in one another in a plane below the sensing plane.

11. The method of claim 10, wherein the at least one attachment element includes two attachment elements, and the two attachment elements and the attachment elements via which the first and second fixed counter electrodes are attached are all in the central area of the substrate.

12. The method of claim 11, wherein a respective reinforcing element is provided on each of the first and second carrier plates to respectively reinforce the first and second carrier plates.

13. The method of claim 10, wherein the seismic mass includes two spring elements that are situated symmetrically to each other and that each includes four stop elements spaced apart from one another, with two of the four stop elements being spaced further apart from each other than the other two of the four stop elements are spaced apart from each other.

14. The method of claim 13, wherein a respective pair of stop elements that are offset from each other by ninety degrees is located at each of exterior corners of, and exterior to the seismic mass.

15. The method of claim 10, wherein an area of the seismic mass is perforated for conveying respective electrical potentials to each of (a) the first electrodes, (b) the first fixed counter electrodes, and (c) the second fixed counter electrodes.

* * * * *